(12) United States Patent
Zhou

(10) Patent No.: US 8,772,524 B2
(45) Date of Patent: Jul. 8, 2014

(54) CVD PRECURSORS

(75) Inventor: Xiaobing Zhou, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 571 days.

(21) Appl. No.: 13/122,745

(22) PCT Filed: Aug. 11, 2009

(86) PCT No.: PCT/US2009/053364
§ 371 (c)(1),
(2), (4) Date: Apr. 6, 2011

(87) PCT Pub. No.: WO2010/047869
PCT Pub. Date: Apr. 29, 2010

(65) Prior Publication Data
US 2011/0195582 A1 Aug. 11, 2011

Related U.S. Application Data

(60) Provisional application No. 61/106,706, filed on Oct. 20, 2008.

(51) Int. Cl.
*C23C 16/42* (2006.01)
*H01L 21/205* (2006.01)

(52) U.S. Cl.
USPC ........................................................ 556/412

(58) Field of Classification Search
None
See application file for complete search history.

(56) References Cited

U.S. PATENT DOCUMENTS

| | | |
|---|---|---|
| 5,001,187 A | 3/1991 | Liles et al. |
| 5,049,611 A | 9/1991 | Baney et al. |
| 6,180,552 B1 | 1/2001 | Hlatky |
| 6,384,229 B1 | 5/2002 | Hlatky |
| 6,541,842 B2 | 4/2003 | Meynen et al. |
| 6,649,540 B2 | 11/2003 | Wang et al. |
| 6,716,770 B2 | 4/2004 | O'Neill et al. |
| 7,074,489 B2 | 7/2006 | O'Neill et al. |
| 2004/0096582 A1 * | 5/2004 | Wang et al. ............. 427/255.27 |
| 2008/0124946 A1 | 5/2008 | Xiao et al. |

FOREIGN PATENT DOCUMENTS

| | | |
|---|---|---|
| EP | 1441042 | 7/2004 |
| JP | 6298938 | 10/1994 |
| WO | 2008050883 | 5/2008 |
| WO | 2008066200 | 5/2008 |

OTHER PUBLICATIONS

Armstrong, J.L.; Sun, Y.-M.; White, J.M., "Thermal Decomposition of 1,1-Dimethylhydrazine on Si(100)-2 X 1", Applied Surface Science 1997, 120, 299-305.
Auner, N.; Grobe, J., "Silaethenes. VIII. Gas-Phase Pyrolysis of Silicon-Halogenated Silacyclobutanes", Journal of Organometallic Chemistry 1981, 222(1), 33-54.
Barton, T.J.; Tillman, N., "Mechanism of the Decomposition of Silacyclobutane to Silylene and Propene", Journal of American Chemical Society 1987, 109, 6711-6.
Conlin, R.T.; Gill, R.S., "Thermal Fragmentation of Silacycobutane. Formation of Silylene, Methylsilylene, and Silene", Journal of American Chemical Society 1983, 105, 618-9.
Davidson, I.M.T.; Fenton, A.; Ijadi-Maghsoodi, S.; Scampton, R.J.; Auner, N.; Grobe, J.; Tillman, N.; Barton, T.J., "Kinetics and Mechanism of Pyrolysis of Hydridosilacyclobutanes", Organometallics 1984, 3, 1593-5.
Jutzi, P.; Langer, P., "Thermolysis and Photolysis of Some Sila- and Disilacycobutanes", Journal of Organometallic Chemistry 1980, 202(4), 401-9.
Gusel 'Nikov, L. E. 'Hetero—systems from 2+2 cycloreversions. Part 1. Gusel 'Nikov-Flowers route to silenes and origination of the chemistry of doubly bonded silicon' Coordination Chemistry Reviews, Sep. 2003. vol. 244 (1-2), pp. 149-240.
Pestunovich, V.A. et al. 'Synthesis and NMR study of intramolecular silacyclobutane complexes: 8-aza-5,11-dioxa-4-silaspirof [3,7] undecane and 8-methyl-8aza-5, 11-dioxa-4-silaspiro[3,7] undecane' ARKIVOC, Aug. 2, 2006, pp. 116-125.

* cited by examiner

*Primary Examiner* — Yevegeny Valenrod
(74) *Attorney, Agent, or Firm* — Dow Corning Corporation; Sharon K. Brady; Claude F. Purchase

(57) ABSTRACT

A method of producing silicon containing thin films by the thermal polymerization of a reactive gas mixture bisaminosilacyclobutane and source gas selected from a nitrogen providing gas, an oxygen providing gas and mixtures thereof. The films deposited may be silicon nitride, silicon carbonitride, silicon dioxide or carbon doped silicon dioxide. These films are useful as dielectrics, passivation coatings, barrier coatings, spacers, liners and/or stressors in semiconductor devices.

12 Claims, 1 Drawing Sheet

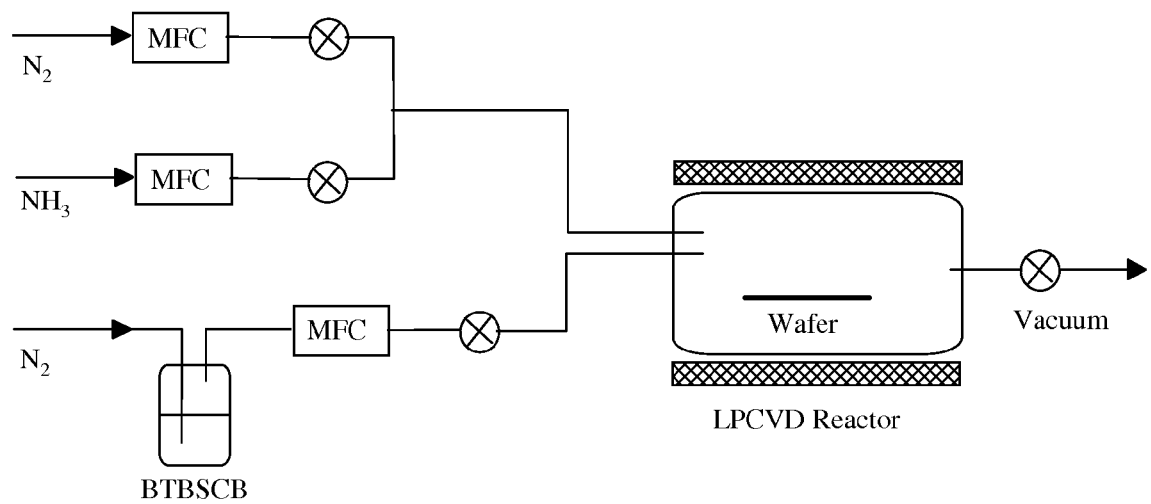

CVD PRECURSORS

CROSS REFERENCE TO RELATED APPLICATIONS

This application is a U.S. national stage filing under 35 U.S.C. §371 of PCT Application No. PCT/US09/53364 filed on 11 Aug. 2009, currently pending, which claims the benefit of U.S. Provisional Patent Application No. 61/106,706 filed 10 Oct. 2008 under 35 U.S.C. §119 (e). PCT Application No. PCT/US09/53364 and U.S. Provisional Patent Application No. 61/106,706 are hereby incorporated by reference.

BACKGROUND OF THE INVENTION

Thin films of silicon dioxide and carbon doped silicon oxide are common dielectrics used in fabrication of semiconductor devices. Deposition of the thin films of these materials at low temperatures is typically achieved with Plasma Enhanced Chemical Vapor Deposition (PECVD) process. However, due to concern over potential plasma damage to transistors, a low temperature process is preferred in some circumstances.

Thermal silicon nitrides or silicon carbonitrides have been used as dielectrics, passivation coating, barrier coating, spacers, liners or stressors in semiconductor devices. Limited by tight thermal budget and heat sensitive components in devices, the semiconductor fabrication industry are looking for new precursors allowing deposition of these films at decreasing temperatures. It is projected that the film deposition temperature could be as low as 400 to 450° C. at 22 nm tech node when the mass production starts. To allow the films to be deposited at such a low temperature, the precursors need to decompose at nearly 200° C. and, meanwhile, still meet the requirement for shelf stability. Perhaps the only silane precursors that have been demonstrated thus far to have such a low thermal decomposition temperature and a good shelf life are the hydrazinosilanes developed by Air Products. It has been disclosed that bis(1,1-dimethylhydrazino)ethylsilane, HEtSi(NH—NMe$_2$)$_2$, gives 15 Å/min film growth rate at 370° C. in ammonia. The 1,1-dimethylhydrazino ligand containing a weak N—N bond is known to decompose below 200° C. on a silicon surface. However, the silicon carbonitride films deposited from hydrazinosilanes had the problem of low density.

Bisaminosilacyclobutanes are proposed as a new family of precursors for low temperature deposition of silicon containing films. These molecules have a strained four-membered silacyclobutane ring which may decompose at a low temperature. However because bisaminosilacyclobutanes decompose through different mechanisms than hydrazinosilanes, bisaminosilacyclobutanes are expected to give superior thin film properties. Bisaminosilacyclobutanes have been prepared in 99+% purity, and found to decompose at 200 to 250° C.

BRIEF SUMMARY OF THE INVENTION

The invention pertains to a method of producing silicon containing thin films by the thermal polymerization of a reactive gas mixture comprising bisaminosilacyclobutane and source gas selected from a nitrogen providing gas, an oxygen providing gas and mixtures thereof. The films deposited may be silicon nitride, silicon carbonitride, silicon dioxide or carbon doped silicon dioxide. These films are useful as dielectrics, passivation coatings, barrier coatings, spacers, liners and/or stressors in semiconductor devices.

BRIEF DESCRIPTION OF THE DRAWINGS

FIG. 1 shows the process for the deposition of silicon carbonitride film in a Low Pressure CVD reactor using bis(t-butylamino)silacyclobutane (BTBSCB).

DETAILED DESCRIPTION OF THE INVENTION

This invention pertains to a method for producing silicon containing films on a substrate wherein the film may be silicon nitride, silicon carbonitride, silicon dioxide or carbon doped silicon dioxide. Typical substrates include but are not limited to, semiconductor substrates, liquid crystal devices, a light emitting diode display device, and an organic light emitting display device. By "semiconductor substrate" it is meant to include, but not be limited to, silicon based devices and gallium arsenide based devices intended for use in the manufacture of a semiconductor components including focal plane arrays, opto-electronic devices, photovoltaic cells, optical devices, transistor-like devices, 3-D devices, silicon-on-insulator devices, super lattice devices and the like. The semiconductor substrates may contain one or more layers of wiring. The semiconductor substrate may also be those substrates prior to the formation of any wiring layers.

Bisaminosilacyclobutanes useful herein are selected from compounds having the formulas and mixtures thereof.

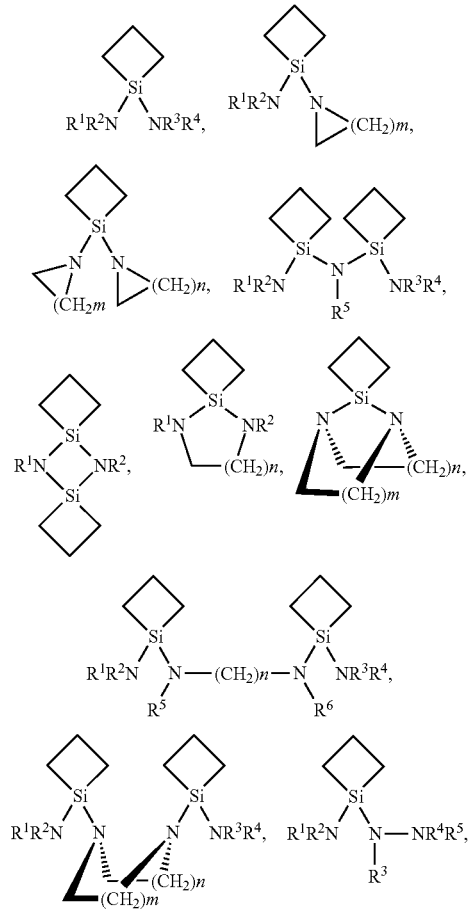

-continued

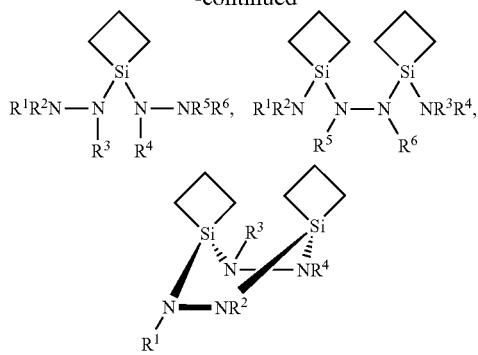

where each $R^1$, $R^2$, $R^3$, $R^4$, $R^5$ and $R^6$ is independently selected from hydrogen or monovalent hydrocarbon (linear, branched or cyclic; saturated or unsaturated) groups having 1 to 6 carbons and m, n have a value of 0 to 10. Each $R^1$, $R^2$, $R^3$, $R^4$, $R^5$ and $R^6$ may be exemplified by, but not limited to methyl, ethyl, propyl, iso-propyl, n-butyl, sec-butyl, t-butyl, cyclohexyl, cyclopropyl, phenyl, vinyl, hexenyl and others.

Bisaminosilacyclobutanes useful herein may be exemplified by compounds having the formulas

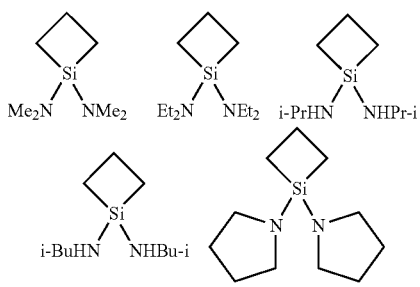

The reactive gas mixture used to produce the films may also comprise a controlled amount of a source gas selected from a nitrogen providing gas, an oxygen providing gas or mixtures thereof. The amount of source gas may be controlled by the type of gas used, or by the film deposition process conditions.

Nitrogen providing gases include, but are not limited to nitrogen $N_2$, ammonia $NH_3$, hydrazine $N_2H_4$, hydrazoic acid $HN_3$, and mixtures thereof. Typically the nitrogen providing gas is ammonia, although hydrazine and hydrazoic acid may be used for low temperature deposition. The amount of nitrogen providing gas is typically 0.1 to 50 volume parts nitrogen providing gas per volume part of bisaminosilacyclobutane, alternatively from 0.2 to 7 volume parts of nitrogen providing gas per volume part of bisaminosilacyclobutane. One skilled in the art will be able to readily determine the amount of nitrogen providing gas based on the type of nitrogen providing gas and the deposition conditions.

Oxygen providing gases include but not limited to oxygen, air, nitrous oxide, nitric oxide, carbon monoxide, peroxides, sulfur dioxide and mixtures thereof. The amount of nitrogen providing gas is typically 0.1 to 50 volume parts oxygen providing gas per volume part of bisaminosilacyclobutane, alternatively from 0.2 to 7 volume parts of oxygen providing gas per volume part of bisaminosilacyclobutane. One skilled in the art will be able to readily determine the amount of oxygen providing gas based on the type of oxygen providing gas and the deposition conditions.

Other materials may be present in the reactive gas mixture. For example, carrier gases such as helium, nitrogen, or argon, dopants such as phosphine or diborane, halogens such as fluorine, halogen-containing gases such as $SiF_4$, $CF_4$, $C_3F_6$ and $C_4F_8$, or any other material that provides additional desirable properties to the film may be present.

The reactive gas mixture is introduced into a deposition chamber containing a substrate, preferably a semiconductor substrate, wherein the polymerization of the bisaminosilacyclobutane is induced resulting in the deposition of a film on the substrate. Thermal chemical vapor deposition such as Low Pressure Chemical Vapor Deposition (LPCVD) or Atomic Layer Deposition (ALD) is preferred due to the low temperatures that can be used and wide use in the industry. Plasma-assisted CVD may also be used to deposit silicon dioxide or carbon doped silicon oxide films from bisaminosilacyclobutanes with or without an oxygen providing gas, or silicon nitride or carbonitride films from bisaminosilacyclobutane with or without a nitrogen providing gas.

In PECVD the gas mixture is reacted by passing it through a plasma field. The plasmas used in such processes comprise energy derived from a variety of sources such as electric discharges, electromagnetic fields in the radio frequency or microwave range, lasers or particle beams. Generally preferred in the plasma deposition processes is the use of radio frequency (10 kHz to $10^2$ MHz) or microwave (1.0 to 10 GHz) energy at moderate power densities (0.1 to 5 watts/cm$^2$). The specific frequency, power and pressure, however are generally tailored to the equipment. Preferably the films are deposited using PECVD at a power of 20 to 1000 W; a pressure of 0.13 to 1333 Pa; and a temperature of 25 to 500° C. Confined, low pressure (0.13-0.65 Pa) microwave frequency plasmas, often referred to as high density plasmas, can be combined with a RF frequency excitation in a process which helps planarize a varying surface topography during CVD growth.

One type of film that may be deposited herein is a silicon carbonitride film. These films typically have the formula $Si_wC_xH_yN_z$ wherein the ratio of C:Si can be in the range of about 0:1 to about 10:1 and the ratio of N:Si can be in the range of about 0:1 to about 1.5:1 with the balance being hydrogen. To deposit a silicon carbonitride film, the co-reactant is a nitrogen providing gas. It is theorized that when the film is deposited from bisaminosilacyclobutane and nitrogen providing gas, the amino groups are replaced with nitrogen source gas through transamination, and the silacyclobutane groups decompose to release gaseous organic species. It is therefore expected that the C:Si ratio in the film would be very different from the C:Si ratio in the precursor. The amount of bisaminosilacyclobutane to nitrogen providing gas is in the range of 1 part of bisaminosilacyclobutane to 100 parts of nitrogen providing gas, alternatively 1 part of bisaminosilacyclobutane to 10 parts of nitrogen providing gas.

Another type of film that may be deposited herein is a silicon nitride film. These films typically have the formula $Si_bH_cN_d$ wherein the ratio of H:Si can be in the range of about 0:1 to about 5:1 and the ratio of N:Si can be in the range of about 0:1 to about 1.5:1. These films are typically deposited using a nitrogen providing gas as the co-reactant. The amount of bisaminosilacyclobutane to nitrogen providing gas is in the range of 1 part of bisaminosilacyclobutane to 100 parts of nitrogen providing gas, alternatively 1 part of bisaminosilacyclobutane to 10 parts of nitrogen providing gas.

Another type of film that may be deposited herein is a silicon oxide film. These films typically have the formula $SiO_x$ where x is from 0 to 3. These films are typically deposited using an oxygen providing gas as the co-reactant. The amount of bisaminosilacyclobutane to oxygen providing gas is in the range of 1 part of bisaminosilacyclobutane to 100 part of oxygen providing gas, alternatively 1 part of bisaminosilacyclobutane to 10 parts of oxygen providing gas.

A fourth type of film that may be deposited herein is a carbon doped silicon dioxide film. The films deposited typically have the composition of $Si_eC_fO_gH_h$ where e has a value of 10 to 33, alternatively 18 to 20 atomic %, f has a value of 1 to 66, alternatively 18 to 21 atomic %, g has a value of 1 to 66, alternatively 31 to 38 atomic % and h has a value of 0.1 to 60, alternatively 25 to 32 atomic %; and e+f+g+h=100 atomic %. These films are typically deposited using an oxygen providing gas as the co-reactant. The amount of bisaminosilacyclobutane to oxygen providing gas is in the range of 1 part of bisaminosilacyclobutane to 100 parts of oxygen providing gas, alternatively 1 part of bisaminosilacyclobutane to 10 parts of oxygen providing gas.

The films deposited herein may be of varying thicknesses. Films having thicknesses of 0.01 to 10 μm may be deposited by the method of this invention. Alternatively, the films have a thickness of 0.5 to 3.0 μm.

The films deposited herein, are particularly suited as dielectrics or barrier metal coatings in semiconductor integrated circuit manufacturing including, but not limited to, gate dielectrics, premetal and intermetal dielectrics and passivation coatings.

FIG. 1 shows the typical process for the deposition of a silicon nitride or carbonitride thin film from bisaminosilacyclobutanes. In this process, wafer substrates are loaded into a Low Pressure CVD (LPCVD) reactor and the LPCVD reactor is heated to a target temperature, and evacuated below $10^{-4}$ torr. Ammonia gas is mixed with diluting nitrogen gas, and the mixed $NH_3$—$N_2$ gas is then metered into the LPCVD reactor. Nitrogen carrier gas is flowed through the sample cylinder containing liquid BTBSCB. The vapor of BTBSCB carried in nitrogen is metered into the LPCVD reactor. After films are deposited, the LPCVD reactor is cooled down and backfilled with nitrogen up to atmospheric pressure. Finally the coated wafer is removed from the LPCVD reactor.

EXAMPLES

The following examples are included to demonstrate embodiments of the invention. It should be appreciated by those of skill in the art that the techniques disclosed in the examples which follow represent techniques discovered by the inventor to function well in the practice of the invention. However, those skilled in the art should, in light of the present disclosure, appreciate that many changes can be made in the specific embodiments which are disclosed and still obtain a like or similar result without departing from the spirit and scope of the invention. All percentages are in wt. %.

Example 1

Bis(t-butylamino)silacyclobutane (BTBSCB) was synthesized by reacting 1,1-dichlorosilacyclobutane with an excess amount of t-butylamine (Equation 1). To do so, 19.7 ml (0.166 mol) 1,1-dichlorosilacyclobutane was added to 105 ml (0.999 mol) t-butylamine in 1 L hexanes at 0° C. After bodying for three days at the room temperature, the reaction slurry was filtered to remove t-butylamine hydrochloride salt. The filtrant was vacuum dried to give a crude liquid product which was then vacuum distilled. 16 g Product was isolated at 99.2% purity in 45% yield at 71° C. under 50 torr pressure. The structure of the product analyzed with $^1H$, $^{13}C$ and $^{29}Si$ NMR, FT-IR and GC-MS was in consistence with bis(t-butylamino)silacyclobutane.

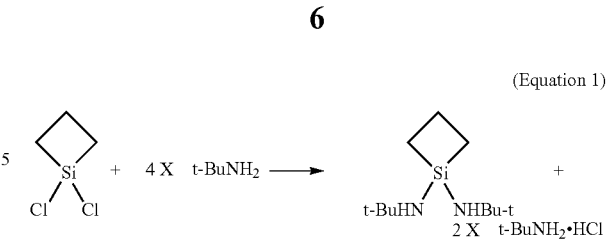

(Equation 1)

Example 2

Bis(ethylamino)silacyclobutane was synthesized by reacting 1,1-dichlorosilacyclobutane with an excess amount of ethylamine (Equation 2). To do so, 20.0 ml (0.169 mol) 1,1-dichlorosilacyclobutane was added to 66.2 ml (1.01 mol) ethylamine in 1 L pentane at −10° C. After bodying for one day at the room temperature, the reaction slurry was filtered to remove ethylamine hydrochloride salt. The filtrant was vacuum dried to give a crude liquid product which was then vacuum distilled. 9.8 g Product was isolated at a purity of at least 99% in 36% yield at 42° C. under 30 torr pressure. The structure of the product analyzed with $^1H$, $^{13}C$ and $^{29}Si$ NMR, FT-IR and GC-MS was in consistence with bis(ethylamino)silacyclobutane.

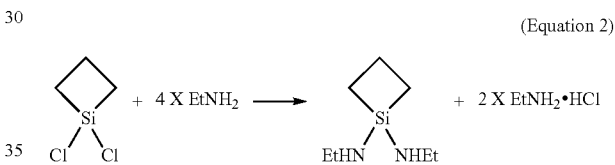

(Equation 2)

Example 3

Bis(pyrrolidino)silacyclobutane was synthesized by reacting 1,1-dichlorosilacyclobutane with an excess amount of pyrrolidine (Equation 3). To do so, 23.7 ml (0.200 mol) 1,1-dichlorosilacyclobutane was added to 100.0 ml (1.20 mol) pyrrolidine in 1 L hexanes at −10° C. After bodying for two day at the room temperature, the reaction slurry was filtered to remove pyrrolidine hydrochloride salt. The filtrant was vacuum dried to give a liquid crude product which was then vacuum distilled. 15.4 g Product was isolated at 99.7% purity in 34% yield at 51° C. under 1 torr pressure. The structure of the product analyzed with $^1H$, $^{13}C$ and $^{29}Si$ NMR, FT-IR and GC-MS was in consistence with bis(pyrrolidino)silacyclobutane.

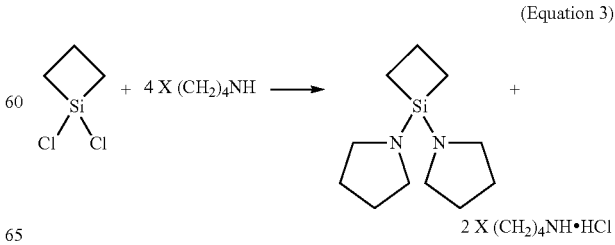

(Equation 3)

Example 4

Determination of Thermal Decomposition Temperatures of Bisaminosilacyclobutanes The bisaminosilacyclobutanes produced in Examples 1-3 were analyzed with Differential Scanning calorimetry (DSC). Thermal decomposition of the molecules starts at the temperature where the exotherm curves start to ramp on the DSC spectra. The thermal decomposition temperatures were determined to be 200° C., 200° C. and 250° C. for bis(t-butylamino) silacyclobutane (BTBSCB), bis(ethylamino)silacyclobutane and bis(pyrrolidino)silacyclobutane respectively. The DSC samples that had gone through the thermal treatment were analyzed with GC-MS to confirm the decomposition of these materials. The decomposition of BTBSCB was further verified with headspace GC run at 200° C. and 295° C.

The invention claimed is:

1. A method for producing silicon containing films on a substrate wherein the method comprises the thermal polymerization of a reactive gas mixture comprising bisaminosilacyclobutane and source gas selected from a nitrogen providing gas, an oxygen providing gas and mixtures thereof, wherein the bisaminosilacyclobutane is selected from

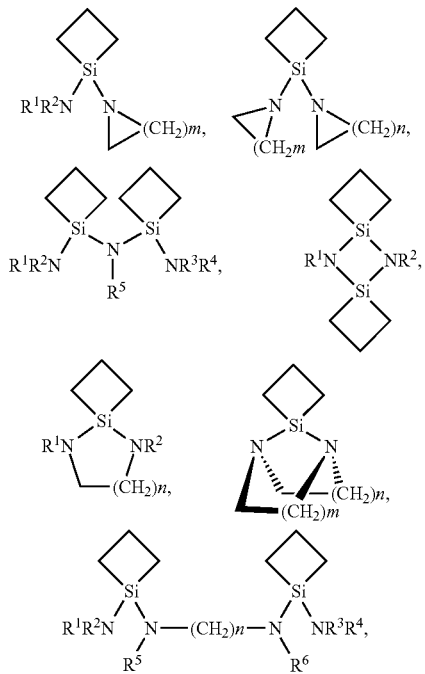

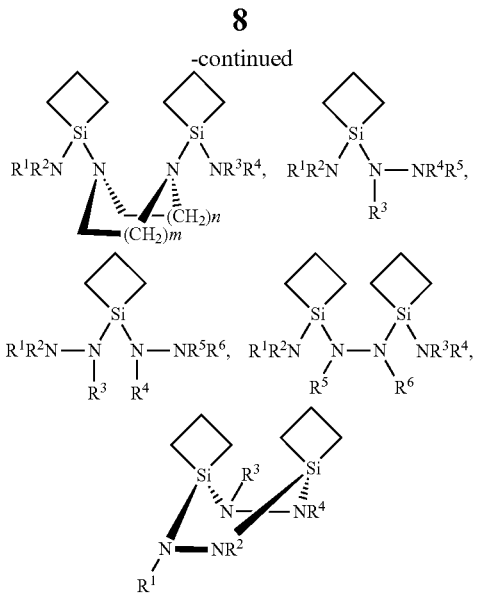

where each $R^1$, $R^2$, $R^3$, $R^4$, $R^5$ and $R^6$ is independently selected from hydrogen and monovalent hydrocarbon group having 1 to 6 carbons and where m, n have a value of 0 to 10.

2. The method as claimed in claim 1 wherein the bisaminosilacyclobutane is Bis(pyrrolidino)silacyclobutane.

3. The method as claimed in claim 1 wherein the source gas is a nitrogen providing gas selected from nitrogen $N_2$, ammonia $NH_3$, hydrazine $N_2H_4$, hydrazoic acid $HN_3$, and mixtures thereof.

4. The method as claimed in claim 1 wherein there is 0.1 to 50 volume parts of nitrogen providing gas per volume part of bisaminosilacyclobutane.

5. The method as claimed in claim 1 wherein the source gas is ammonia.

6. The method as claimed in claim 1 wherein the source gas is an oxygen providing gas and there is 0.1 to 50 volume parts of oxygen providing gas per volume part of bisaminosilacyclobutane.

7. The method as claimed in claim 1 wherein there is also present a material selected from carrier gases, dopants, halogens and halogen-containing gases.

8. The method as claimed in claim 1 wherein the substrate is a semiconductor substrate.

9. The method as claimed in claim 1 wherein the thermal polymerization is carried out by low pressure chemical vapor deposition or by atomic layer deposition.

10. The method as claimed in claim 1 wherein the film deposited is a silicon carbonitride film, a silicon nitride film, a silicon oxide film, or a carbon doped silicon dioxide film.

11. The method as claimed in claim 1 wherein the film deposited has a thickness of 0.01 to 10 μm.

12. A composition comprising Bis(pyrrolidino)silacyclobutane.

* * * * *